United States Patent [19]
Kong et al.

[11] Patent Number: 6,029,268
[45] Date of Patent: Feb. 22, 2000

[54] QUALITY CALCULATOR APPARATUS FOR USE WITH VITERBI-DECODED DATA USING ZERO-STATE METRICS

[75] Inventors: Jun-jin Kong, Seongnam; Sung-han Choi, Suwon, both of Rep. of Korea

[73] Assignee: Samsung Electronics Co., Ltd., Kyungki-Do, Rep. of Korea

[21] Appl. No.: 09/000,839

[22] Filed: Dec. 30, 1997

[30]     Foreign Application Priority Data

Jun. 14, 1997 [KR]   Rep. of Korea ..................... 97-24723

[51] Int. Cl.⁷ ...................................... G06F 11/10
[52] U.S. Cl. .................... 714/795; 714/796; 375/262; 375/265; 375/341
[58] Field of Search ..................... 714/755, 774, 714/775, 784, 786, 789, 795, 796; 375/225, 262, 265, 316, 340, 341, 365, 377; 370/465

[56]         References Cited

U.S. PATENT DOCUMENTS

| | | | |
|---|---|---|---|
| 4,527,279 | 7/1985 | Yasuda et al. | 375/365 |
| 5,157,672 | 10/1992 | Kondou et al. | 714/795 |
| 5,390,198 | 2/1995 | Higgins | 714/796 |
| 5,648,991 | 7/1997 | Namekata et al. | 375/341 |
| 5,710,784 | 1/1998 | Kindred et al. | 375/262 |
| 5,878,098 | 3/1999 | Wang et al. | 375/377 |
| 5,881,075 | 3/1999 | Kong et al. | 714/795 |

FOREIGN PATENT DOCUMENTS 8-139695   5/1996   Japan .............................. H04J 13/02

OTHER PUBLICATIONS

A. J. Viterbi and J. K. Omura, "Principles of Digital Communication and Coding", McGraw–Hill, 1979, pp. 227–239, rows 3–6 in p. 231, and rows 5–7 in p. 237.

*Primary Examiner*—Emmanuel L. Moise
*Attorney, Agent, or Firm*—Sughrue, Mion, Zinn, Macpeak & Seas, PLLC

[57]           ABSTRACT

A quality calculator apparatus for Viterbi-decoded data using zero-state metrics. The quality calculator for the Viterbi-decoded data includes: a Viterbi decoder which outputs zero-state metrics of input demodulated data according to the four possible transmission rates of FULL, HALF, QUARTER and 1/8; a register which stores respective zero-state metrics output from the Viterbi decoder; and a quality evaluation unit which reads the zero-state metrics stored in the register to evaluate the Viterbi-decoded data based on the zero-state metrics and which determines the actual transmission rate to be the one among the possible transmission rates which has the least zero-state metrics. The zero-state metrics of the demodulated data input to the Viterbi decoder are used as a quality evaluation parameter so that the quality evaluation can be correctly achieved to avoid errors in determining of the transmission rate, as compared to a quality calculator using a bit error ratio as the quality evaluation parameter.

14 Claims, 3 Drawing Sheets

QUALITY CALCULATOR APPARATUS FOR USE WITH VITERBI-DECODED DATA USING ZERO-STATE METRICS

BACKGROUND OF THE INVENTION

1. Field of the Invention

The present invention relates to a quality calculator apparatus for use with data decoded by a Viterbi decoder using an encoder tail bit in a convolutional coding system, and more particularly, to a quality calculator apparatus for Viterbi-decoded data that uses zero-state metrics (ZSM) from state metrics obtained through the operation of an add-compare-select unit of the Viterbi decoder.

2. Description of Related Art

In a general communication system, error correction coding is used to keep the level of errors below a predetermined level. This is done by correcting errors caused when a signal passes through a transmission channel contaminated by noise and by other factors which prevent reliable communication. Error correction coding is classified as one of two types: block coding, for adding redundancy corresponding to a block of the data to be transmitted, and convolutional coding, for encoding the sequentially input data according to a generation function of the encoding method. In a communication system adopting convolutional coding, the means for calculating communication quality is very important in reducing the error in determining transmission rate.

SUMMARY OF THE INVENTION

It is an object of the present invention to provide a quality calculator apparatus for use with Viterbi-decoded data, in which zero-state metrics of demodulated data input to a Viterbi-decoder, according to four possible transmission rates, are used as parameters for the quality evaluation in order to calculate the quality of the decoded data. In addition, a transmission rate of the data is determined using the zero-state metrics, thereby decreasing errors.

To achieve the above object, a quality calculator apparatus for use with Viterbi-decoded data has been developed using zero-state metrics comprising:

a Viterbi decoder which outputs zero-state metrics of input demodulated data, according to each of some possible transmission rates;

a register which stores respective zero-state metrics output from the Viterbi decoder; and a quality evaluation unit which reads the zero-state metrics stored in the register to evaluate the Viterbi-decoded data based on the zero-state metrics and which determines the actual transmission rate to be the one which has the least zero-state metrics.

Preferably, transmission rates include the four rates of FULL, HALF, QUARTER and ⅛.

BRIEF DESCRIPTION OF THE DRAWING

The above object and advantages of the present invention will become more apparent by describing in detail a preferred embodiment thereof with reference to the attached drawings in which.

DESCRIPTION OF THE PREFERRED EMBODIMENT

Figure 1:
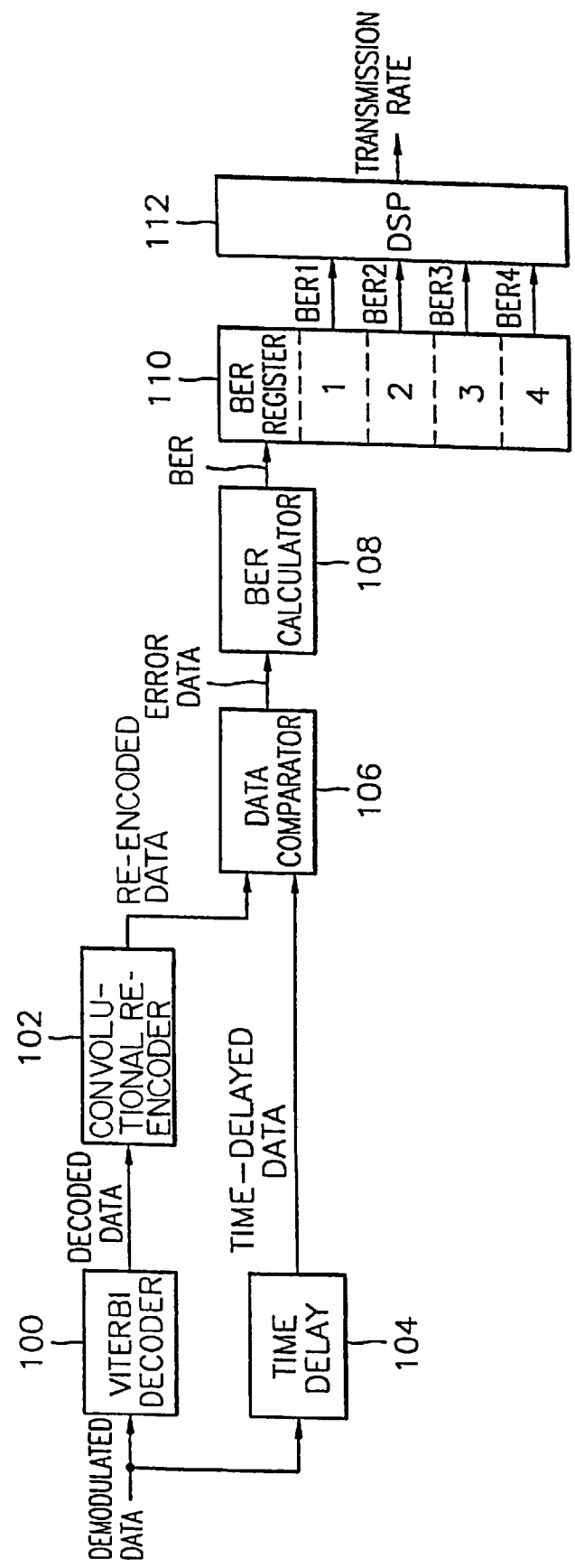
FIG. 1 is a block diagram of a quality calculator apparatus for Viterbi-decoded data, using a bit error ratio.

Digital cellular mobile communication and personal communications services (PCS) use a cyclic redundancy code (CRC) and a convolutional code for detecting and correcting a transmission error, and adopt code division multiple access (CDMA) standards (IS-95 and J-STD-008). Referring to those standards, a method for measuring a bit error ratio (BER) using the CRC and the convolutional coding method will be described.

According to the CDMA standard, the transmission rate of a voice signal is not fixed, but varies between four rates using a voice signal activity detector for detecting the active state of the generated voice signal. Table 1 shows the transmission rates according to the CDMA standards (IS-95 and J-STD-008) which are the standards for a digital cellular mobile communication and PCS.

In the cases of the CDMA cellular system and RATE SET1 of PCS, if a state where a voice signal is the most active is detected by a voice signal activity detector, the voice signal is transmitted at the maximum rate of 9600 bps. Also, if a state where the voice signal is the least active is detected, the voice signal is transmitted at the minimum rate of 1200 bps, which is the minimum level required for continuously maintaining a channel between a base station and a terminal. Also, when the voice signal changes from the most active state to the least-active state or from the least active state to the most active state, the voice signal is transmitted at intermediate rates of 4800 bps or 2400 bps.

TABLE 1

| transmission rate | IS-95 CDMA cellular | PCS (J-STD-008) RATE SET1 | PCS (J-STD-008) RATE SET2 |
|---|---|---|---|
| FULL | 9600 bps | 9600 bps | 14400 bps |
| HALF | 4800 bps | 4800 bps | 7200 bps |
| QUARTER | 2400 bps | 2400 bps | 3600 bps |
| ⅛ | 1200 bps | 1200 bps | 1800 bps |

Transmitting information at different transmission rates according to the degree of activity of the voice signal allows effective use of required transmission power by transmitting the minimum amount of information required for maintaining a communication channel between the base station and the terminal, when only a small amount of information needs to be transmitted. Doing so reduces both the power consumption of the terminal and also an interference signal affecting other users. This allows many simultaneous users.

As described above, a frame quality indicator (FQI) data CRC is added to the information data, generated according to the transmission rate determined by the activity of the voice signal, in order to check whether a frame received by a receiver has any errors and to provide parameters required for determining the transmission rate of the received frame. In more detail, when the transmission rate is at 9600 bps, a 12-bit CRC12 is added by considering 172 bits of information data as one block, and an entire 8-bit encoder tail bit sequence following the CRC12 set to "0", to constitute one frame including 192 bits. When the transmission rate is at 4800 bps, an 8-bit CRC8 is added by considering 80 bits of information data as one block and an encoder tail bit sequence including only "0" bits is used, to constitute one frame including 96 bits. Finally, when the transmission rate is at 1200 bps and 2400 bps, one frame is constituted by adding only the encoder tail bit sequence of "0" bits, without adding a CRC.

According to the CDMA cellular system (IS-95), a convolutional coding method has been adopted, where the constraint length is set to 9 and the encoding rate is ⅓. The generation function of the convolutional coding is expressed by octal numbers, for example, 557, 663 and 711. Also, whenever one bit is input, three encoded data bits are output.

The data which has passed through a CRC generator and a convolutional encoder according to the CDMA standard is transmitted to a radio channel via a symbol repeater, a block interleaver, a 64-array orthogonal modulator, a frequency spreader, a phase modulator, and an RF frequency unit.

Meanwhile, the receiver performs a demodulation in the opposite sequence to that of the transmitter. The demodulated data is decoded by a Viterbi decoder, which is a maximum likelihood decoder. The demodulated data is decoded into the most likely original data, given the data received from the transmitter. The data decoded by the Viterbi decoder is used to check whether the frame transmitted, together with the CRC added by the transmitter, includes an error or not. In the CDMA system, information about the transmission rate determined by an audio activity detector of the transmitter is not transmitted, so an actual transmission rate, among four possible transmission rates, is determined by using the frame error.

FIG. 1 is a block diagram showing the structure of a quality calculator apparatus for Viterbi-decoded data using a bit error ratio.

In a communication system using convolutional coding, a quality calculator for Viterbi-decoded data, using a bit error ratio, includes:

a Viterbi decoder 100, a convolutional re-encoder 102, a time delay 104, a data comparator 106, a bit error ratio (BER) calculator 108, a bit error ratio (BER) register 110 and a quality calculator 112.

The Viterbi decoder 100 decodes demodulated data using the maximum likelihood decoding method.

The convolutional re-encoder 102 receives the decoded data from the Viterbi decoder 100 and performs convolutional coding using the same convolutional coding method of the transmitter.

The time delay 104 also receives the demodulated data and compensates for the time delay caused by the data passing through the Viterbi decoder 100 and the convolutional re-encoder 102 by providing the same time delay as the above two elements.

The data comparator 106 compares the re-encoded data output from the convolutional re-encoder 102 with the time delayed data output from the time delay 104.

The BER calculator 108 calculates the bit error ratio for each of the four possible transmission rates by using the error data output from the data comparator 106.

The BER register 110 stores the bit error ratio of each of the four possible transmission rates, calculated by the BER calculator 108.

The quality calculator 112, which is embodied by a digital signal processor (DSP), reads the bit error ratios stored in the BER register 110 to determine which of the possible transmission rates gives the least error, and selects that one as the actual transmission rate.

Next, the operation of the quality calculator using the bit error ratio of a communication system adopting a convolutional coding method will be described with reference to FIG. 1.

Data demodulated by a demodulator of a receiver consists of encoded symbols from the convolutional encoder of the transmitter. This data may include an error at each bit due to channel noise, a fading phenomenon, or an interference signal. As the demodulated data, including errors, passes through the Viterbi decoder 100, the errors are corrected within a correctable range, and the demodulated data is decoded to data of the same frame type as that of the transmitter. The decoded data output from the Viterbi decoder 100 is re-encoded by the convolutional re-encoder 102 in units of one frame in the same manner as the convolutional coder in the transmitter. If the data encoded at the transmitter by the convolutional encoder is unknown, the re-encoded data can be assumed to be the same as the original transmitted data, because the decoded data output from the Viterbi decoder 100 includes less error because the errors in the demodulated data are corrected to below a predetermined level.

Thus, the data comparator 106 compares the re-encoded data, assumed to be the transmitted data, with the delayed demodulated data passed through the time delay 104, to generate error data. The BER calculator 108 classifies the error data bits output from the data comparator 106 as either: a bit without error or an erroneous bit. The BER calculator 108 calculates the ratio of the erroneous bits to the whole input data, resulting in a bit error ratio. Here, the BER calculator 108 calculates bit error ratio with respect to each of the four possible transmission rates from the input of one frame of data. The bit error ratios calculated by the BER calculator 108 are each stored in an assigned portion of the bit error register 110. The quality calculator 112 reads the bit error ratios stored in the BER register 110 to determine which of the possible transmission rates gives the least bit error ratio, and selects that one as the actual transmission rate.

The above-described quality calculator calculates the bit error ratios assuming that the demodulated data is corrected to be the same as the transmitted data. However, if the errors in the demodulated data are not corrected completely by the Viterbi decoder, the bit error ratio is calculated based on data including error, where erroneous bits are mis-recognized as correctly received bits. Accordingly, the actual bit error ratio cannot be calculated correctly, therefore, the transmission rate of the transmitted data may be determined incorrectly.

Figure 2:
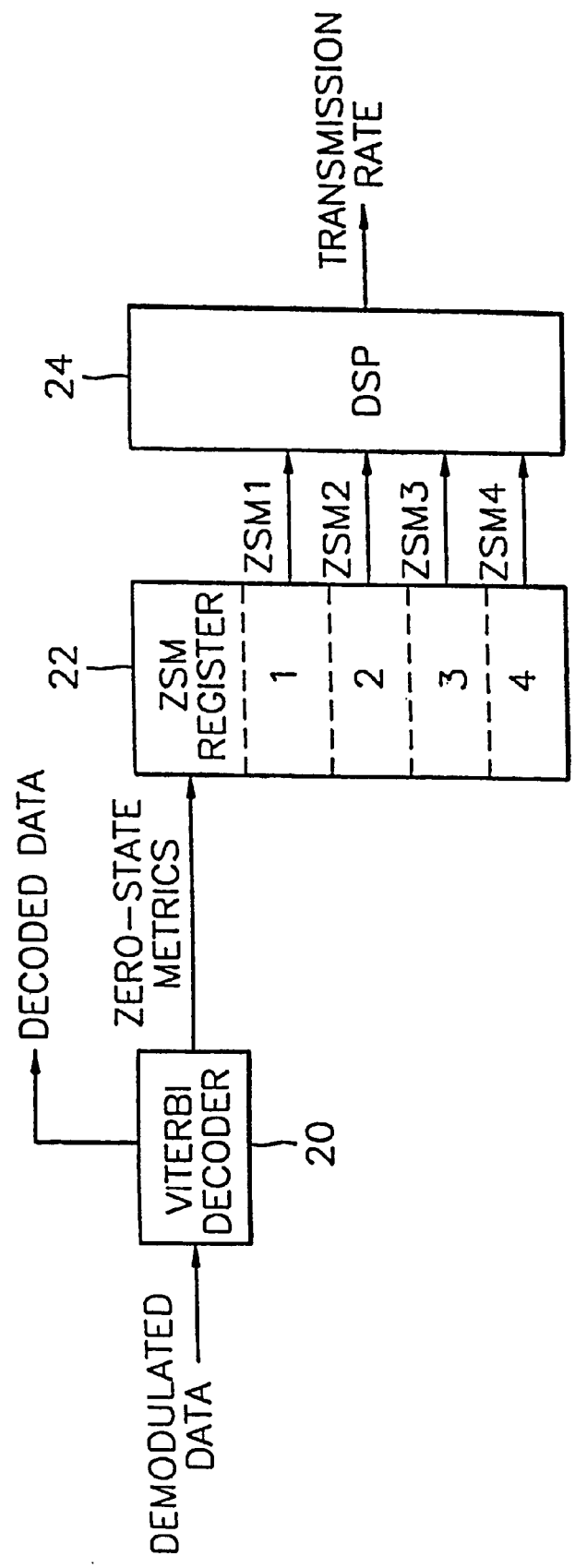
FIG. 2 is a block diagram of a quality calculator apparatus for Viterbi-decoded data using zero-state metrics according to the present invention.

Referring to FIG. 2, the quality calculator for use with Viterbi-decoded data according to the present invention includes: a Viterbi decoder 20, a zero-state metrics (ZSM) register 22 and a quality evaluator 24.

The Viterbi decoder 20 outputs zero-state metrics of the input decoded data with respect to each of several possible transmission rates such as 9600 bps, 4800 bps, 2400 bps and 1200 bps.

The ZSM register 22 stores each of the zero-state metrics output from the Viterbi decoder 20.

The quality evaluator 24, which is embodied by a digital signal processor (DSP), reads the zero-state metrics stored in the register 22, and evaluates the quality of the Viterbi-decoded data to determine which of the possible transmission rates gives the minimum zero-state metrics and selects that one as the actual transmission rate.

Figure 3:
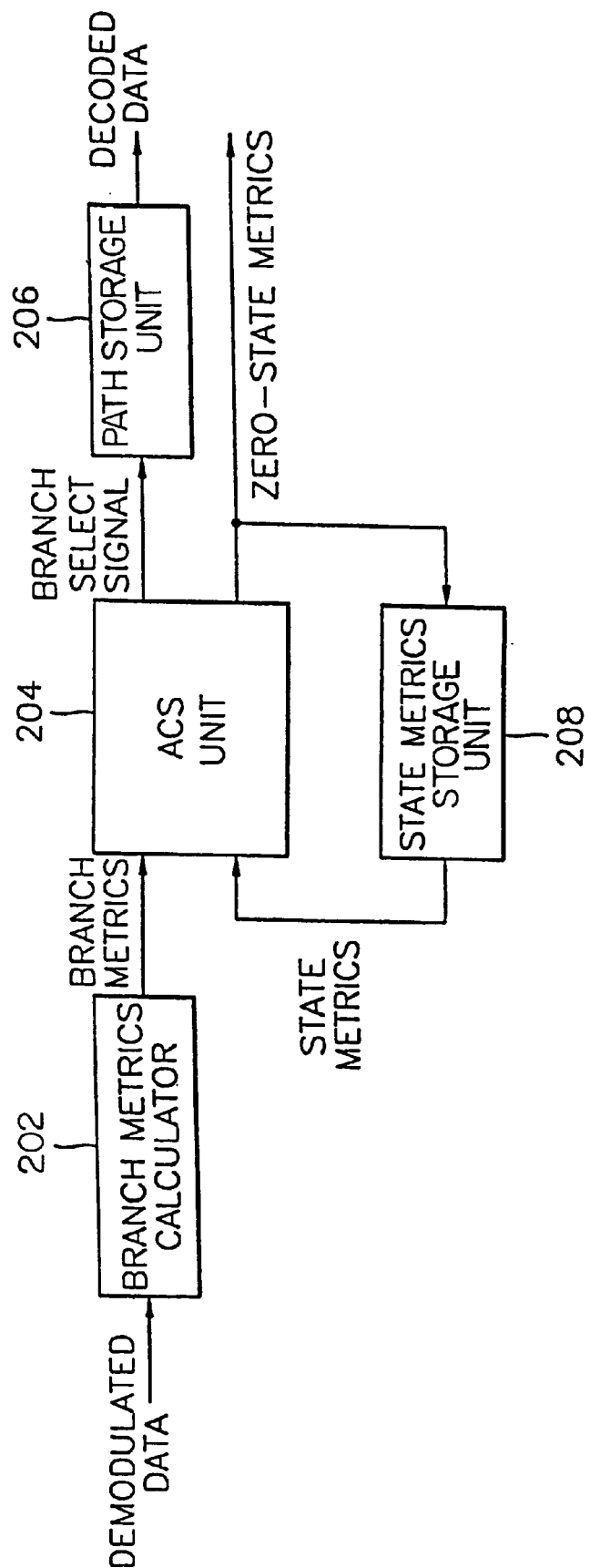
FIG. 3 is a detailed block diagram of the Viterbi decoder of FIG. 2.

Referring to FIG. 3, the Viterbi decoder 20 from FIG. 2 includes: a branch metrics calculator 202, a state metrics storage unit 208, an add-compare-select (ACS) unit 204 and a path storage unit 206. Here, the data of the state metrics storage unit 208 is updated by new state metrics output from the add-compare-select unit 204.

The branch metrics calculator 202 calculates branches according to each of the four possible transmission rates based on the input demodulated data and a state diagram of the system configuration.

The state metric storage unit 208 stores the state metrics of previous survival paths.

The add-compare-select unit 204 receives the branch metrics output from the branch metrics calculator 202 and the state metrics stored in the state metric storage unit 208, adds the received branch metrics and state metrics according to the trellis diagram, and compares the added values to output a path select signal whose state metrics are the lowest among the values compared and the state metrics of the selected path.

The path storage unit 206 stores the corresponding path indicated by the path select signal output from the add-compare-select unit 204.

Hereinafter, the overall operation of the quality calculator apparatus according to the present invention will be described.

The demodulated data is error-corrected within a correctable range by the Viterbi decoder 20 and decoded to frame type data, as constituted at the transmitter. Then, the Viterbi decoder 20 calculates zero-state metrics with respect to each of the four possible transmission rates. The zero-state metrics output from the Viterbi decoder 20 are each stored in a separate portion of the register 22. The quality evaluator 24 reads the zero-state metrics stored in the register 22 and evaluates the quality of the Viterbi-decoded data to determine which of the possible transmission rates has the minimum zero-state metric and selects that one as the actual transmission rate.

The quality calculator for the Viterbi-decoded data according to the present invention can more reliably determine the transmission rate of the received data when the actual transmission rate is not known, as in the IS-95 cellular system and IS-95 based CDMA PCS (J-STD-008) system as compared to conventional calculators.

In the above-described quality calculator for Viterbi-decoded data, using the zero-state metrics, according to the present invention, the zero-state metrics of the demodulated data input to the Viterbi decoder are used as a quality evaluation parameter. Therefore, the quality evaluation can be correctly achieved to avoid errors in determining the transmission rate, as compared to the quality calculator using a bit error ratio as the quality evaluation parameter.

What is claimed is:

1. A quality calculator for Viterbi-decoded data, using zero-state metrics, in a communication system adopting convolutional coding, the quality calculator comprising:

a Viterbi decoder for outputting zero-state metrics of input demodulated data, according to each of a plurality of transmission rates;

a register for storing respective zero-state metrics output from said Viterbi decoder; and a quality evaluation unit for reading the zero-state metrics stored in said register, to evaluate the Viterbi-decoded data based on the zero-state metrics, and for determining the actual transmission rate to be the one among said plurality of transmission rates which has the least zero-state metrics.

2. The quality calculator of claim 1, wherein said transmission rates include the four rates of FULL, HALF, QUARTER and 1/8.

3. The quality calculator of claim 1, wherein the quality evaluation unit is a digital signal processor.

4. The quality calculator of claim 1, wherein said quality evaluation unit selects said least zero-state metric as the actual transmission rate.

5. The quality calculator of claim 1, wherein the Viterbi decoder comprises:

a branch metrics calculator for calculating branches according to each of said plurality of transmission rates;

a state metrics storage unit for storing state-metrics of previous survival paths;

an add-compare-select unit for receiving branch metrics output from said branch metrics calculator and state metrics storage unit, adding said received branch metrics and state metrics, and comparing said added values to output a path select signal; and a path storage unit for storing a corresponding path indicated by said path select signal output from the add-compare-select unit.

6. The quality calculator of claim 5, wherein said branch metrics calculator calculates branches based on input demodulated data and a state diagram.

7. The quality calculator of claim 5, wherein said add-compare-select unit adds said received branch metrics and state metrics according to a trellis diagram.

8. The quality calculator of claim 5, wherein the state metrics of said path select signal are the lowest among said values compared.

9. In a convolutional coding communication system, a method of Viterbi-decoding a received signal using zero-state metrics, the method comprising the steps of:

outputting said zero-state metrics of input demodulated data, according to each of a plurality of transmission rates;

storing said respective zero-state metrics; and reading said stored zero-state metrics to evaluate said Viterbi-decoded data based on the zero-state metrics, and determining the actual transmission rate to be the one among said plurality of transmission rates which has the least zero-state metrics.

10. The method of claim 9, wherein said transmission rates include the four rates of FULL, HALF, QUARTER and 1/8.

11. The method of claim 9, wherein said outputting step comprises the steps of calculating branches according to each of said plurality of transmission rates; storing state-metrics of previous survival paths; receiving calculated branch metrics and stored state metrics, adding said received branch metrics and state metrics, and comparing said added values to output a path select signal; and storing a corresponding path indicated by said path select signal.

12. The method of claim 11, wherein the calculation is based on input demodulated data and a state diagram.

13. The method of claim 11, wherein said adding said received branch metrics and state metrics is performed according to a trellis diagram.

14. The method of claim 11, wherein the state metrics of said path select signal are the lowest among said values compared.

* * * * *